Sept. 15, 1959 H. O. WOLCOTT 2,904,757

VARIABLE FREQUENCY OSCILLATORS

Filed April 25, 1956

INVENTOR.
HENRY O. WOLCOTT

BY Harry R. Lubcke
AGENT 2,904,757
Patented Sept. 15, 1959

2,904,757

VARIABLE FREQUENCY OSCILLATORS

Henry O. Wolcott, Glendale, Calif., assignor, by mesne assignments, to International Telephone and Telegraph Corporation, a corporation of Maryland Application April 25, 1956, Serial No. 580,603

16 Claims. (Cl. 331—180)

My invention relates to a variable frequency oscillator, particularly one in which the frequency of oscillation is varied by electrical means and which frequency is stable to a high order for any given electrical control signal.

For electrical beat frequency oscillators, swept frequency generators and similar electronic equipment a variable frequency oscillator is required. Invariably, a high degree of frequency stability and reproducibility is desired of such an oscillator and the precision and usefulness of a whole device may be determined by the performance of the variable frequency oscillator. I have been able to achieve a frequency stability due to random effects of the order of two parts per million in a variable frequency oscillator by the coordinated action of several novel circuit aspects.

In order that the frequency of the oscillator may be controlled by electrical means a reactance tube is employed. This I have arranged to appear as an almost pure inductance to the oscillator, having minimized the resistance component, thus achieving a maximum frequency range with a minimum of associated variations taking place in the oscillator.

In the oscillator itself the inductor is substantially unloaded, thus preserving a very high "Q" (the ratio of inductive reactance to equivalent A.C. resistance). Also, the frequency of oscillation is at the frequency to which the resonant circuit is tuned, not somewhat to one side thereof as usually occurs in oscillators known to the prior art. This new functioning enhances the frequency stability of the oscillator.

The grid current of the oscillator tube is supplied by a cathode-follower tube rather than from the circulating energy of the resonant circuit, thus unloading this circuit as mentioned. The oscillator may be embodied utilizing a pentode vacuum tube as well as a triode.

An object of my invention is to provide a variable frequency oscillator having a high order of frequency stability for any selected value of electrical frequency control.

Another object is to provide a large range of substantially pure inductive reactance variation for varying the frequency of a variable frequency oscillator.

Another object is to provide an oscillator in which the electrical energy demand upon the circulating current in the resonant circuit is low.

Another object is to operate an oscillator at the resonant frequency of the resonant circuit which forms a part of it.

Another object is to employ a cathode-follower vacuum tube to supply the grid current of an oscillator vacuum tube.

Another object is to provide an oscillator having a low harmonic energy content.

Other objects of my invention will become apparent upon reading the following detailed specification and upon examining the related drawings, in which.

Figure 1:
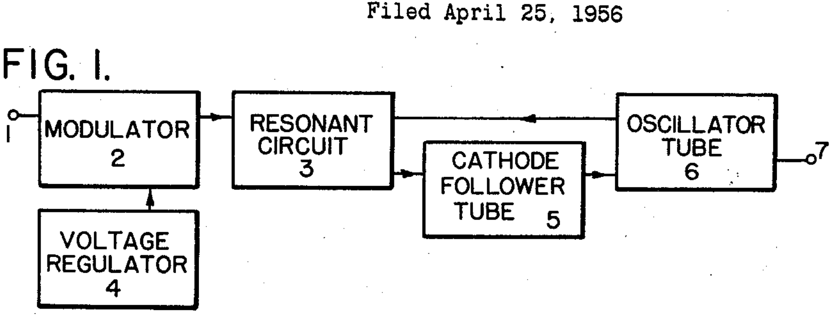
Fig. 1 shows a block diagram of my variable frequency oscillator.

In Fig. 1, terminal 1 is where the electrical potential is impressed to control the frequency of the oscillator. This may be a D.C. potential, but more often it is an A.C. one, such as a triangular or sawtooth waveform to cause the oscillator to systematically sweep a band of frequencies.

Modulator 2 is comprised of a vacuum tube and associated circuitry for impressing a reactive component upon the resonant circuit 3. I obtain desired functioning from the modulator by providing a cathode-screen-plate voltage regulator 4. Resonant circuit 3 is comprised of inductors and capacitors, the latter being connected to feed cathode-follower tube 5 at approximately half the impedance of the overall circuit.

The plate of oscillator tube 6 is connected to the high impedance end of resonant circuit 3, as represented, while the cathode is coupled to cathode-follower tube 5. The useful output is taken from terminal 7, the cathode of oscillator tube 6.

Figure 2:
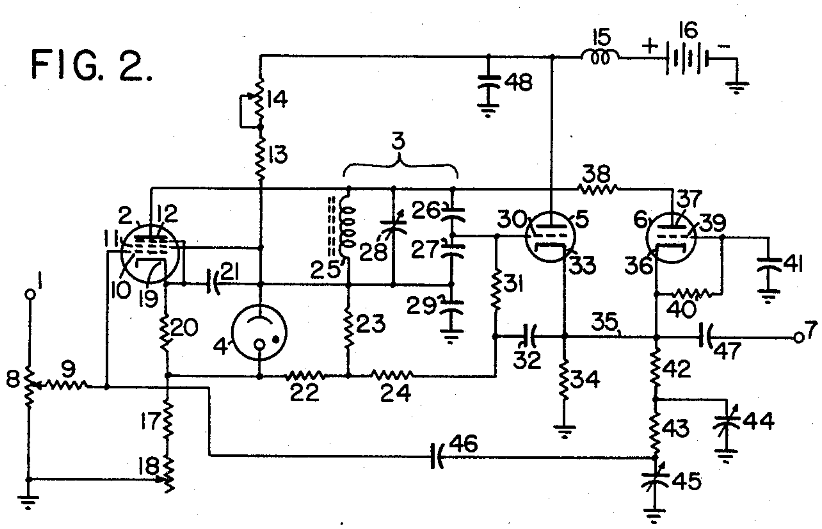
Fig. 2 shows a schematic diagram of the same.

The schematic circuit of Fig. 2 gives details. Certain circuit elements are shown adjustable as desired for instrument type variable frequency oscillators but which need not be adjustable in general applications. Input potentiometer 8, for instance, allows adjustment of the frequency deviation, or swing, from a fixed potential or waveform impressed at terminal 1. Fixed resistor 9 is for isolation and to provide an impedance for electrical energy mixing purposes to be later described. Control grid element 10 of modulator vacuum tube 2 is connected thereto, conveying the frequency-changing signal to the system. Voltage regulator tube 4 is ordinarily of the gaseous discharge type, maintaining a voltage of the order of 100 volts upon the screen grid 11 and plate 12 elements of tube 2.

Fixed resistor 13 is a screen and plate dropping resistor for the modulator tube and variable resistor 14 in series therewith is a convenient adjustment of the zero frequency from which the oscillator is made deviate by potential variations on grid 10. Inductor 15 is a radio frequency choke for the particular frequency range of the oscillator, and at 16, connected to the choke, a B battery or regulated power supply provides the plate voltage for the system.

The circuit of regulator 4 reaches ground through resistors 17 and 18. Variable resistor 18 allows adjustment of the D.C. potential on cathode 19 of modulator tube 2, thus of the resting frequency of the oscillator in the absence of a modifying potential on grid 10 and independent of interaction upon deviation control 8. This occurs because regulator tube 4 acts in shunt to modulator tube 2, absorbing more signal current when this is small through tube 2 and vice versa. Thus, no signal is present across resistors 17 and 18. Variable resistor 18 serves to move the operating D.C. potentials of screen-grid, cathode and plate either more positively or more negatively as a group, hence changing the effective potential of control grid 10 of tube 2. Cathode resistor 20 gives some degeneration to the circuit of tube 2, enhancing the stability thereof. Capacitor 21 is a radio frequency screen grid bypass. Resistors 22 and 23 comprise a voltage divider across tube 4 to set the grid voltage of cathode-follower 5. Resistor 24, connected to the junction of 22 and 23, is for isolation.

Inductive reactance for resonant circuit 3 is provided by inductor 25. This is shown as a powdered iron coil, as useful for a frequency of the order of 500 kilocycles, but may be air core for higher frequencies or iron core for lower. A relatively high Q for the coil is desirable and is obtainable. In combination with the resonant capacitors and as lightly loaded in my system it is possible to obtain operating Q's of the order of 100 in commercial apparatus.

Capacitative reactance at the frequency mentioned for the resonant circuit is largely obtained by two seriesed low temperature coefficient capacitors 26 and 27 having individual capacitances in excess of 100 micromicrofarads. Variable capacitor 28 is of lower capacitance and is for relatively fine frequency adjustment of the oscillator. Because of the reactance tube modulator, most frequency adjustments are made by altering electrical potentials. Capacitor 29 is a relatively large value bypass to ground for alternating currents. The lower plate of capacitor 27 of the resonant circuit is thus at signal ground, whereas the upper plate of capacitor 26 is at maximum signal impedance.

Grid element 30 of cathode-follower tube 5 is connected at the half signal impedance point between the two capacitors 26 and 27. Grid return resistor 31 is connected to voltage divider 22 and 23 through isolating resistor 24 as previously noted. Capacitor 32 is connected to cathode 33 rather than to ground so that substantially the same oscillator signal appears at both ends of resistor 31. This results in a relatively high effective resistance valve for resistor 31 insofar as loading resonant circuit 3 is concerned. This is one of the several arrangements I employ to insure light loading of the resonant circuit.

The plate of tube 5 connects to the positive voltage source through radio frequency choke 15. Signal frequency energy does not appear at the plate, this being eliminated by radio frequency bypass capacitor 48. Cathode 33 of tube 5 connects to resistor 34 and thence to ground. The output signal is the cathode energy which is direct-coupled by conductor 35 to cathode 36 of oscillator tube 6.

The plate 37 of oscillator tube 6 does not connect directly to the positive voltage source 16, but through resistor 38 of appreciable resistance with respect to the resonant impedance of circuit 3 to the plate 12 of modulator tube 2. The latter is held at the fixed supply potential determined by regulator tube 4 acting through inductor 25. The grid 30 of tube 5 being similarly referenced to the regulator tube potential through voltage divider 22 and 23 and direct coupling existing between tubes 5 and 6, the DC potential of cathode 36 of tube 6 is uniquely determined with respect to the DC potential of plate 37 thereof. In instrument embodiments this effective plate to cathode potential is of the order of 10 to 15 volts, depending upon the circuit values chosen, but quite fixed for any particular set of values chosen. Resistor 38 reduces the loading upon resonant circuit 3 slight though it is at the low plate potential of tube 6.

The grid of tube 6 is connected to the cathode thereof through resistor 40 and to ground through capacitor 41. The time constant of this RC combination is preferably of the order of five times the duration of a radio frequency cycle. This provides the grid bias for this tube and amplitude stabilization of the oscillations. A considerably longer time constant may not be used because blocking oscillator action takes place; i.e., intermittent oscillation.

Capacitor-resistor group 42, 43, 44, 45 comprises a two stage phase shift circuit employed to obtain an accurate ninety electrical degree phase shift at oscillator radio frequency. Resistor 43 and capacitor 45 provide the major portion of this shift, capacitor 45 has a greater capacitance than capacitor 44. Capacitor 46 affords coupling back to the grid 10 of tube 2 over resistor 9. This back coupling at exactly 90° allows the operation of the modulator tube to be purely reactive in inductive quadrature to the electrical energy of the resonant circuit. A relatively wide linear deviation of oscillator frequency is thereby accomplished. In a representative embodiment this is plus or minus 10% of the carrier frequency, or 20% total linear swing.

It is to be noted that resistor 34 is the cathode resistor for tube 6 as well as for tube 5, being the only one thus connected which returns conductively to ground. The output of the system is taken from the cathode of tube 6 via low reactance capacitor 47 to output terminal 7. The peak to peak voltage output approaches twice that of the plate supply voltage to oscillator tube 6; i.e., from 20 to 30 volts for the voltages previously mentioned.

Figure 3:
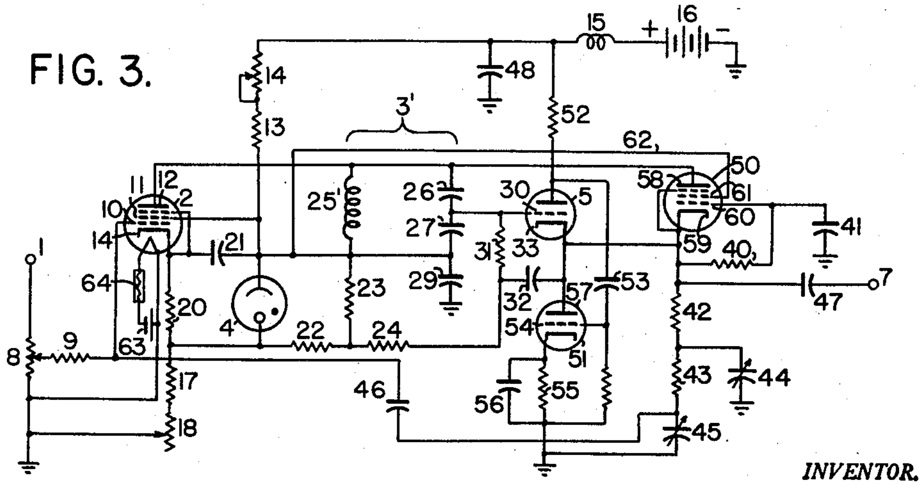
Fig. 3 shows a schematic diagram of an alternate embodiment thereof.

An alternate embodiment of my variable frequency oscillator is shown in Fig. 3. The important differences from Fig. 2 lie in the use of a pentode tube 50 instead of the triode 6 and in the use of a new cathode impedance tube 51 associated with the cathode-follower tube 5.

In Fig. 3 the modulator 2 and regulator 4 portions of the circuit are substantially as shown in Fig. 2. Resonant circuit 3 becomes 3' with the elimination of vernier capacitor 28 and the use of an air-core inductor 25'. Tubes 5 and 51 comprise a unity gain full feedback coupled amplifier. Tube 5 is coupled to the remaining circuit as in Fig. 2 save that a resistor 52 is inserted in the plate circuit of tube 5 across which a signal voltage appears. This is conveyed by capacitor 53 of negligible reactance at the oscillating frequency to grid 54 of tube 51. Cathode resistor 55 and bypass capacitor 56 suitably bias tube 51. The plate 57 thereof is connected directly to cathode 33 of tube 5, thus the signal in the two tubes is fully fed back and the gain around the loop is unity. This has the effect of lowering the output impedance at cathode 33 to the order of one-twentieth of the value for tube 5 alone, as in Fig. 2, and of considerably increasing the input impedance at grid 30 of that tube. This further reduces the loading upon resonant circuit 3' with respect to that of 3, of Fig. 2, and so enhances desirable operating characteristics.

Oscillator tube 50, being a pentode, has a high dynamic plate impedance. Thus, prior resistor 38 is not employed in connecting plate 58 to resonant circuit 3' and still the loading of that circuit during periods of conduction of tube 50 is less than before. Screen grid 61 is connected directly to the regulated terminal of regulator tube 4 by conductor 62 in order to obtain an appropriate fixed voltage supply.

The objects of my invention are attained in the following ways.

The high degree of frequency stability is obtained because oscillating circuit 3 is substantially unloaded and because oscillation is at the resonant frequency of that circuit.

As to unloading, cathode-follower tube 5 has a high input impedance and is coupled to the resonant circuit at the half impedance point thereof. The grid current required for oscillator tube 6 is supplied from the voltage source 16 through tube 5 and not from the resonant circuit. The plate circuit of oscillator tube 6 is of high impedance as viewed from the resonant circuit, hence the energy consumed is small. In Fig. 2 the triode oscillator tube is operated at a low voltage, thus at high plate impedance, and resistor 38 further raises the plate impedance of the tube as seen from the resonant circuit, particularly during the half radio frequency cycle of tube conduction. In Fig. 3 the plate impedance of the pentode vacuum tube 50 is well known to be high at all times. Thus, the Q of the resonant circuit in oscillator operation is very nearly that for complete isolation of that circuit, hence high, and the frequency stability of oscillation is correspondingly high.

The frequency of oscillation is at the frequency of resonance of resonant circuit 3 (or 3') because I am able to feed back voltage of exactly proper phase. This is a non-phase-inverting oscillator in contrast to the usual oscillator. In the latter, because of inductive or other couplings involved in the oscillation feedback circuit, the energy is not fed back exactly in phase, thus the frequency of oscillation is slightly removed from the frequency of resonance of the resonant circuit. When this is the case the degree of removal is determined by the characteristics of the auxiliary circuits and the vacuum tube parameters. When these values change for any of a number of reasons the frequency of oscillation is also changed. Under such conditions it is known that alteration of the plate supply voltage causes very considerable frequency variation. With my circuit a change of such voltage of 50% causes only a very small frequency change and under usual conditions of operation the frequency change from random causes is only two parts per million according to tests on operative embodiments. Suitable construction is employed to minimize long term frequency drift due to thermal conditions of warm up, etc.

I obtain a substantially pure inductive reactance from modulator tube 2 because of the accuracy of the 90° phase shift fed back by network 42, 43, 44, 45. This being of two stage construction the accuracy can be very great. With one stage 90° can be approached but not attained in practical apparatus. The two stage construction results in an increase in the range of reactive variation and also eliminates loading the resonant circuit by a resistive component of impedance being fed back to the modulator tube and consequently imposed upon the resonant circuit.

It has previously been mentioned that a 20% linear frequency sweep is obtainable. In an embodiment operating at 550 kilocycles the sweep is from 500 to 600 kc., and this is accomplished with only a two volt change of potential at the grid of the modulator.

While there is no theoretical limit to the frequency of operation of this oscillator I often construct it in the hundreds of kilocycles range for beat frequency oscillator operation. Without alteration, save for the understandable proper choice of resonant circuit and other frequency-sensitive components for each range, the oscillator can be constructed for operating frequencies as low as a few tens of cycles as high as 10 to 15 megacycles. At the higher frequencies the circuit of Fig. 2 for the cathode-follower tube 5 is superior. The usual attention to minimize vacuum tube and stray capacities, of course, must be given.

A high degree of frequency stability is more easily obtained by regulating the heater supply to the modulator tube 2. In Fig. 3 battery 63 is shown as the supply and regulator 64 as an elevated temperature resistance unit. These elements may also be the usual alternating current filament transformer and an electronic or magnetic type regulator. The heater supply of oscillator tubes 6 or 50 may also be regulated for still slightly improved frequency stability, or this supply may be conventional, as so indicated by the conventional omission of the heater element and its supply on the schematic circuits.

It will be understood that certain variations in the construction of this variable frequency oscillator are possible without departing from the scope of my invention. The pentode oscillator of Fig. 3 may be substituted for the triode one of Fig. 2. Similarly, the simple cathode-follower tube 5 of Fig. 2 may be substituted for tubes 5 and 51 in Fig. 3.

Impedances having some reactive components in addition to major in-phase components may also be substituted for resistors and non-D.C.-conducting impedances for capacitors as long as the accuracy of the zero degree phase angle accuracy of the oscillatory feedback and of the ninety degree inductance component for the reactance tube are not impaired.

Energy at harmonic frequencies of the basic frequency of oscillation is substantially absent in my oscillator because of the high operating Q of the resonant circuit.

The vacuum tubes utilized in my invention may be anything from subminiature to power vacuum tubes in size and power handling capability. Four element tubes may also be used in place of pentodes.

Other modifications in details of circuit elements, operating characteristics, range of frequency and output, and means of regulation for obtaining constancy of operating parameters may be made without departing from the scope of my invention as set forth in the following claims.

Having now fully described my invention and the manner in which it is to be practiced, I claim:

1. A variable frequency oscillator comprising one inductor, capacitors connected to said inductor, said capacitors and said inductor constituting a unitary resonant circuit; a cathode-follower having at least input and cathode elements, the input element thereof connected across part of said resonant circuit, the cathode element thereof connected through impedance means to ground; said inductor connected through low impedance means to ground; an oscillator having input, cathode and output elements, the output element thereof connected to said inductor, the cathode element thereof connected to the cathode element of said cathode-follower, the input element thereof connected to bias means; a modulator having input, cathode and output elements, the input element thereof connected for electrical frequency control of said oscillator, the cathode element thereof connected to ground through an impedance, the output element thereof connected to said inductor; and a network connected from the cathode element of said oscillator to the input element of said modulator; the recited elements constituted and connected to impose only a light electrical energy load upon said resonant circuit, said cathode-follower connected as recited to supply oscillatory electrical energy to said oscillator under the control of said resonant circuit, and said network connected as recited to return a voltage inductive with respect to the oscillating voltage of said resonant circuit to the input element of said modulator.

2. The variable frequency oscillator of claim 1 in which the heater element of said modulator is energized by a regulated electric power source to enhance the inherent frequency stability of said variable frequency oscillator.

3. A variable frequency oscillator comprising an inductor having terminals, plural capacitors connected in shunt to said inductor, said capacitors and said inductor constituting a resonant circuit to determine the natural oscillation frequency of said oscillator; a cathode-follower tube having at least a grid, cathode and plate, the grid thereof connected to a low impedance connection of said connected capacitors, the cathode thereof connected through impedance means to ground, the plate thereof connected to a source of electrical energy; one terminal of said inductor connected through a capacitor to ground; an oscillator tube having at least a grid, cathode and plate, the plate thereof connected to the other terminal of said inductor, the cathode thereof connected to the cathode of said cathode-follower tube, the grid thereof connected to a bias circuit having a time constant greater than the duration of a cycle of said natural oscillation frequency; a modulator tube having at least a control grid, cathode, screen and plate, the control grid thereof connected to an input terminal for electrical frequency control of said oscillator, the cathode thereof connected to ground through impedances, the plate thereof connected to the other terminal of said inductor, a voltage regulator, the screen of said modulator tube connected to said voltage regulator and to the one terminal of said inductor, said voltage regulator also connected through one of the previously said impedances to ground; and a network connected from the cathode of said oscillator tube to the grid of said modulator tube; the recited elements constituted and connected to impose only a light electrical energy load upon said resonant circuit, said cathode-follower tube connected as recited to supply oscillatory electrical energy to said oscillator tube under the control of said resonant circuit, and said network connected as recited to return a voltage inductive with respect to the oscillating voltage of said resonant circuit to the grid of said modulator tube.

4. A variable frequency oscillator having high frequency stability to random ambient conditions comprising an inductor, two capacitors connected in series, said capacitors connected in shunt to said inductor, said capacitors and said inductor constituting a resonant circuit to determine the natural oscillation frequency of said oscillator; a cathode-follower tube having at least a grid, cathode and plate, the grid thereof connected to the center connection of the series connected capacitors, the cathode thereof connected through impedance means to ground, the plate thereof connected to a source of electrical energy; one end of said inductor connected through a capacitor to ground; an oscillator tube having at least a grid, cathode and plate, the plate thereof connected to the other end of said inductor, the cathode thereof connected to the cathode of said cathode-follower tube, the grid thereof connected to a self-bias circuit having a time constant several times the duration of a cycle of said natural oscillation frequency; a modulator tube having at least a control grid, cathode, screen and plate, the control grid thereof connected through a resistor to an input terminal for electrical frequency control of said oscillator, the cathode thereof connected to ground through plural resistors, the plate thereof connected to the other end of said inductor, a regulator tube having terminals, the screen of said modulator tube connected to the regulated terminal of said regulator tube and to the one end of said inductor, the opposite terminal of said regulator tube connected through one of the previously said plural resistors to ground; and a resistance-capacitance phase shift network connected from the cathode of said oscillator tube to the control grid of said modulator tube; the recited elements constituted and connected to lightly load said resonant circuit, said cathode-follower tube connected as recited to supply oscillatory electrical energy to said oscillator tube under the substantially wattless control of said resonant circuit, and said phase shift network connected as recited to return a voltage accurately inductive with respect to the oscillating voltage of said resonant circuit to the grid of said modulator tube.

5. The variable frequency oscillator of claim 4 in which the control grid of said modulator is also connected through a potentiometer to said input terminal to adjust the variation of frequency of said oscillator and the one of the previously said plural resistors in the cathode circuit of said modulator tube that is connected to ground is variable to adjust the resting frequency of said oscillator.

6. A variable frequency oscillator having high frequency stability to random ambient conditions and a wide range of frequency variation comprising an inductor having two terminals, two capacitors connected in series, said capacitors connected in shunt to said inductor, said capacitors and said inductor constituting a resonant circuit to determine the natural oscillation frequency of said oscillator; a cathode-follower tube having at least a grid, cathode and plate, the grid thereof connected to the center connection of the series connected capacitors, the cathode thereof connected through impedance means to ground, the plate thereof connected to a source of electrical energy; one terminal of said inductor connected through a capacitor of small reactance to ground; an oscillator tube having at least a grid, cathode and plate, the plate thereof connected to the other terminal of said inductor, the cathode thereof connected to the cathode of said cathode-follower tube, the control grid thereof connected to a resistor-capacitor self-bias circuit having a time constant several times the duration of a cycle of said natural oscillation frequency; a modulator tube having at least a control grid, cathode, plate and screen, the control grid thereof connected through a resistor to an input terminal for the electrical frequency control of said oscillator, the cathode thereof connected to ground through two serially connected resistors, the plate thereof connected to the other terminal of said inductor, a voltage regulator tube having terminals, the screen of said modulator tube connected to the controlled terminal of said voltage regulator tube and to the one terminal of said inductor, the opposite terminal of said voltage regulator tube connected through one of said serially connected resistors to ground; and a two section resistance-capacitance phase shift network connected from the cathode of said oscillator tube to the control grid of said modulator tube through a coupling capacitor; the recited elements composed and connected to lightly load said resonant circuit, said cathode-follower tube connected as recited to supply oscillatory electrical energy to said oscillator tube under the substantially wattless control of said resonant circuit, and said phase shift network connected as recited to return a voltage accurately ninety electrical degrees inductive with respect to the oscillating voltage of said resonant circuit to the control grid of said modulator tube.

7. An electrically controlled variable frequency oscillator having high frequency stability to random ambient conditions and a wide range of frequency variation comprising an inductor having terminals, capacitors connected to said inductor, said capacitors and said inductor constituting a resonant circuit to determine the natural oscillation frequency of said oscillator, a cathode-follower having at least a grid, cathode and plate, the grid thereof connected to a low impedance connection of said connected capacitors, the cathode thereof connected through an impedance to ground, one terminal of said inductor connected through a capacitative impedance to ground; an oscillator tube having at least a grid, cathode and plate, the plate thereof connected through a resistor to the other terminal of said inductor, the cathode thereof connected to the cathode of said cathode-follower, the grid thereof connected to a bias circuit having a time constant several times the duration of a cycle of said natural oscillation frequency; a modulator having at least a control grid, cathode, plate and screen, the control grid thereof constituting an input terminal for the electrical frequency control of said oscillator, the cathode thereof connected to ground through impedances, the plate thereof connected to the other terminal of said inductor, a regulator, the screen of said modulator connected to said regulator and to the one terminal of said inductor, said regulator also connected through one of the previously said impedances to ground; and a phase shift network connected from the cathode of said oscillator tube to the grid of said modulator; the recited circuit constituted and coactively connected to lightly load said resonant circuit, said cathode-follower connected as recited to supply oscillatory electrical energy to said oscillator tube under the substantially wattless control of said resonant circuit, and said phase shift network connected as recited to return a voltage accurately ninety degrees inductive with respect to the oscillating voltage of said resonant circuit to the grid of said modulator.

8. A variable frequency oscillator comprising an inductor, capacitors connected in shunt to said inductor, said capacitors and said inductor constituting a reconant circuit to determine the natural oscillation frequency of said oscillator; a cathode-follower vacuum tube having a grid, cathode and plate, the grid thereof connected to an intermediate impedance point upon said connected capacitors, the cathode thereof connected through a resistor to ground, said inductor connected through a capacitor to ground; an oscillator vacuum tube having at least a grid, cathode and plate, the plate thereof connected to said inductor, the cathode thereof connected to the cathode of said cathode-follower vacuum tube, the grid thereof connected to a self-bias component group; a modulator vacuum tube having at least a grid, cathode, screen and plate, the control grid thereof connected to effect electrical control of the frequency of said oscillator according to the potential of said control grid, the cathode thereof connected to ground through two resistors, the plate thereof connected to said inductor, a voltage regulator, the screen of said modulator vacuum tube connected to said voltage regulator and to said inductor, said voltage regulator also connected through one of said two resistors to ground, a voltage divider connected across said voltage regulator, the divided voltage terminal of said voltage divider connected to the grid of said cathode-follower vacuum tube; and a phase shift network connected from the cathode of said oscillator vacuum tube to the control grid of said modulator vacuum tube; the recited circuit arrangement composed and coactively connected to impose only a light energy load upon said resonant circuit, said cathode-follower vacuum tube connected as recited to supply oscillatory electrical energy to said oscillator vacuum tube under the control of said resonant circuit, said phase shift network connected as recited to return a voltage inductive with respect to the oscillating voltage of said resonant circuit to the control grid of said modulator vacuum tube; the cathode of said oscillator vacuum tube constituted to serve as the output terminal of said variable frequency oscillator.

9. An electrically controlled variable frequency oscillator having frequency stability to random ambient conditions and a range of frequency variation comprising an inductor having two terminals, two capacitors connected in series, said capacitors connected in shunt across said inductor terminals, said capacitors and said inductor constituting a resonant circuit to determine the natural oscillation frequency of said oscillator; a cathode-follower vacuum tube having a grid, cathode and plate, the grid thereof connected to the center connection of the series connected capacitors, the cathode thereof connected through a resistor to ground, one terminal of said inductor connected through a capacitor to ground; an oscillator vacuum tube having at least a grid, cathode and plate, the plate thereof connected through a resistor to the other terminal of said inductor, the cathode thereof connected to the cathode of said cathode-follower vacuum tube, the grid thereof connected to a self-bias combination having a time constant several times the duration of a cycle of said natural oscillation frequency; a modulator vacuum tube having at least a control grid, cathode, plate and screen grid, the control grid thereof connected through a resistor to an input terminal for effecting electrical control of said oscillator, the cathode thereof connected to ground through two resistors, the plate thereof connected to the other terminal of said inductor, a voltage regulator having two terminals, the screen grid of said modulator vacuum tube connected to the regulated terminal of said voltage regulator and to the one terminal of said inductor, the opposite terminal of said voltage regulator connected through one of said two resistors to ground, a voltage divider connected across said voltage regulator, the divided voltage terminal of said voltage divider connected through a resistor to the grid of said cathode-follower vacuum tube; and a phase shift network connected from the cathode of said oscillator vacuum tube to the control grid of said modulator vacuum tube; the recited circuit elements composed and coactively connected to lightly load said resonant circuit, said cathode-follower vacuum tube connected as recited to supply oscillatory electrical energy to said oscillator vacuum tube under the control of said resonant circuit, and said phase shift network connected as recited to return a voltage accurately inductive with respect to the oscillating voltage of said resonant circuit to the control grid of said modulator vacuum tube.

10. An electrically controlled variable frequency oscillator having high frequency stability to random ambient conditions and a wide range of frequency variation comprising an inductor having extremity terminals, two capacitors connected in series, said capacitors connected in shunt to said inductor terminals, said capacitors and said inductor constituting a resonant circuit to determine the natural oscillation frequency of said oscillator; a cathode-follower vacuum tube having a grid, cathode and plate, the grid thereof connected to the center connection of the series connected capacitors, the cathode thereof connected through a resistor to ground, one terminal of said inductor connected through a capacitor of small reactance to ground; an oscillator vacuum tube having at least a grid, cathode and plate, the plate thereof connected through a resistor to the other terminal of said inductor, the cathode thereof connected to the cathode of said cathode-follower vacuum tube, the grid thereof connected to a resistor-capacitor self-bias combination having a time constant several times the duration of a cycle of said natural oscillation frequency; a modulator vacuum tube having at least a control grid, cathode, screen grid and plate, the control grid thereof connected through a resistor to an input terminal for effecting electrical control of said oscillator frequency, the cathode thereof connected to ground through two serially connected resistors, the plate thereof connected to the other terminal of said inductor, a two terminal voltage regulator tube, the screen grid of said modulator vacuum tube connected to the regulated terminal of said voltage regulator tube and to the one terminal of said inductor, the opposite terminal of said voltage regulator tube connected through one of said serially connected resistors to ground, a voltage divider connected across said voltage regulator tube, the divided voltage terminal of said voltage divider connected through a resistor to the grid of said cathode-follower vacuum tube; and a two section resistor-capacitor phase shift network connected from the cathode of said oscillator vacuum tube to the control grid of said modulator vacuum tube through a coupling capacitor; the recited circuit elements constituted and coactively connected to lightly load said resonant circuit, said cathode-follower vacuum tube connected as recited to supply oscillatory electrical energy to said oscillator vacuum tube under the substantially wattless control of said resonant circuit, said phase shift network connected as recited to return a voltage accurately ninety electrical degrees inductive with respect to the oscillating voltage of said resonant circuit to the control grid of said modulator vacuum tube, and the cathode of said oscillator vacuum tube connected to the output terminal of said variable frequency oscillator.

11. A variable frequency oscillator comprising an inductor, capacitors connected to said inductor, said capacitors and said inductor constituting a resonant circuit to determine the natural oscillation frequency of said oscillator; a cathode-follower having a grid, cathode and plate, the grid thereof connected to a low impedance connection of said connected capacitors, a second tube having at least a grid, cathode and plate, the plate of said cathode-follower connected to the grid of said second tube, the cathode of said cathode-follower connected directly to the plate of said second tube, the cathode of said second tube connected to bias means and thence to ground; said inductor connected through capacitor means to ground; a pentode oscillator tube having a grid, cathode, plate screen and suppressor, the plate thereof connected to said inductor, the cathode thereof connected to the cathode of said cathode-follower, the grid thereof connected to a bias circuit; a modulator tube having at least a control grid, cathode, screen and plate, the control grid thereof constituting an input terminal for electrical frequency control of said oscillator; the cathode thereof connected to ground through impedances, the plate thereof connected to said inductor, an electrical amplitude regulator, the screen of said modulator tube connected to said electrical amplitude regulator and to said inductor, said electrical amplitude regulator also connected through one of said impedances to ground, the grid of said cathode-follower connected to said electrical amplitude regulator at an amplitude less than that connected to said one terminal of said inductor, the screen of said pentode oscillator tube connected to the screen of said modulator tube; and a phase shift network connected from the cathode of said pentode oscillator tube to the control grid of said modulator tube; the said cathode-follower connected to lightly load said resonant circuit, said cathode-follower and said second tube coactively connected as recited to supply oscillatory electrical energy to said pentode oscillator tube under the control of said resonant circuit, and said phase shift network connected as recited to return a voltage inductive with respect to the oscillating voltage of said resonant circuit to the control grid of said modulator tube.

12. A controlled variable frequency oscillator having frequency stability to random ambient conditions and a wide range of frequency variation comprising an inductor having terminals, capacitors connected in shunt to said inductor, said capacitors and said inductor constituting a resonant circuit to fix the natural oscillation frequency of said oscillator; a cathode-follower tube having at least a grid, cathode and plate, the grid thereof connected to a low impedance connection of said connected capacitors, a second tube having at least a grid, cathode and plate, the plate of said cathode-follower tube connected to the grid of said second tube through a capacitor, the cathode of said cathode-follower tube connected directly to the plate of said second tube, the cathode of said second tube connected to a bias circuit and thence to ground; one terminal of said inductor connected through another capacitor to ground; a plural grid oscillator tube having at least a grid, cathode, screen and plate, the plate thereof connected to the other terminal of said inductor, the cathode thereof connected to the cathode of said cathode-follower vacuum tube, the grid thereof connected to a circuit having a time constant several times the duration of a cycle of said natural oscillation frequency; a modulator tube having at least a grid, cathode, screen and plate, the grid thereof constituting an input terminal for the electrical control of the frequency of said oscillator, the cathode thereof connected to ground through resistors, the plate thereof connected to the other terminal of said inductor, a voltage regulator having terminals, the screen of said modulator tube connected to one terminal of said voltage regulator and to one terminal of said inductor, the opposite terminal of said voltage regulator connected through one of said resistors to ground, a voltage divider connected through a resistor to the grid of said cathode-follower tube, the heater of said modulator tube connected to a regulated electric power source, the screen of said plural grid oscillator tube connected to the screen of said modulator tube; and a two section phase shift network connected from the cathode of said plural grid oscillator tube to the grid of said modulator tube; said cathode-follower connected to lightly load said resonant circuit, said cathode-follower tube and said second tube constituted and connected as recited to supply oscillatory electrical energy to said plural grid oscillator tube under the substantially wattless control of said resonant circuit, said phase shift network constituted and connected as recited to return a voltage accurately inductive with respect to the oscillating voltage of said resonant circuit to the grid of said modulator tube, and the cathode of said plural grid oscillator tube connected to the output element of said variable frequency oscillator.

13. An electrically controlled variable frequency oscillator having high frequency stability to random ambient conditions and a wide range of frequency variation comprising an inductor having two terminals, two capacitors connected in series, said capacitors connected in shunt to said inductor terminals, said capacitors and said inductor constituting a resonant circuit to determine the natural oscillation frequency of said oscillator; a cathode-follower vacuum tube having at least a grid, cathode and plate, the grid thereof connected to the center connection of the series connected capacitors, a second vacuum tube having at least a grid, cathode and plate, the plate of said cathode-follower vacuum tube connected to a resistor and also to the grid of said second vacuum tube through a capacitor, the cathode of said cathode-follower vacuum tube connected directly to the plate of said second vacuum tube, the cathode of said second vacuum tube connected to a resistor-capacitor bias circuit and thence to ground; one terminal of said inductor connected through a capacitor of small reactance at said natural oscillation frequency to ground; a pentode oscillator tube having a grid, cathode, screen, plate and suppressor, the plate thereof connected to the other terminal of said inductor, the cathode thereof connected to the cathode of said cathode-follower vacum tube, the grid thereof connected to a resistor-capacitor self-bias circuit having a time constant several times the duration of a cycle of said natural oscillation frequency; a modulator vacuum tube having a grid, cathode, screen, plate and suppressor, the control grid thereof connected through a resistor to an input terminal for effecting electrical control of said oscillator, the cathode thereof connected to ground through two serially connected resistors, the plate thereof connected to the other terminal of said inductor, a voltage regulator tube, the screen of said modulator vacuum tube connected to the regulated terminal of said voltage regulator tube and to one terminal of said inductor, the opposite terminal of said voltage regulator tube connected through one of said serially connected resistors to ground, a voltage divider connected across said voltage regulator tube, the divided voltage terminal of said voltage divider connected through a resistor to the grid of the cathode-follower vacuum tube, the heater of said modulator vacuum tube connected to a regulated electric power source, the screen of said pentode oscillator tube connected to the screen of said modulator vacuum tube; and a two section resistor-capacitor phase shift network connected from the cathode of said pentode oscillator tube to the control grid of said modulator vacuum tube through a coupling capacitor; said cathode-follower vacuum tube and said second vacuum tube constituted and connected as recited to supply oscillatory electrical energy to said pentode oscillator tube under the substantially wattless control of said resonant circuit, and said phase shift network constituted and connected as recited to return a voltage accurately ninety electrical degrees inductive with respect to the oscillating voltage of said resonant circuit to the control grid of said modulator vacuum tube, the cathode of said pentode oscillator tube constituting the output element of said variable frequency oscillator.

14. A variable frequency oscillator comprising a resonant circuit, a cathode-follower electron device having input and output elements, an input element thereof connected to said resonant circuit, oscillator means having input and output elements, an output element thereof connected to said resonant circuit and an input element of said oscillator means connected to said cathode-follower electron device, an electric power source, an output element of said cathode-follower electron device energized from said electric power source to supply substantially all the electrical energy required to actuate said oscillator means under substantially wattless control of electrical energy circulating in said resonant circuit, a modulator electron device having input and output elements, an output element thereof connected to said resonant circuit, and a network connected between an input element of said oscillator means and an input element of said modulator electron device to retard the phase of electrical energy from said oscillator means to quadrature behind the electrical energy circulating in said resonant circuit.

15. A variable frequency oscillator comprising a resonant circuit, a cathode-follower tube having input and output elements, an input element thereof connected across part of said resonant circuit, an oscillator tube having input and output elements, an output element thereof connected to said resonant circuit and an input element thereof connected to said cathode-follower tube, a power supply, an output element of said cathode-follower tube energized by said power supply to provide substantially all the electrical energy required to actuate said oscillator tube under substantially wattless control of electrical energy circulating in said resonant circuit, a modulator tube having input and output elements, output elements thereof connected across said resonant circuit, and a dissipative network connected between an input element of said oscillator tube and an input element of said modulator tube to shift the phase of electrical energy from said oscillator tube to quadrature lagging with respect to the electrical energy circulating in said resonant circuit, for electrically effectuating the characteristic of inductance.

16. A variable frequency oscillator comprising an inductor-capacitor resonant circuit, a cathode-follower tube having input and cathode electrodes, the input electrodes thereof connected across part of said resonant circuit, an oscillator tube having input and output electrodes, an output electrode connected to said resonant circuit and an input electrode connected to the cathode electrode of said cathode-follower tube, an electrical power supply, said cathode-follower tube connected to said electrical power supply to supply substantially all the electrical energy required to energize said oscillator tube substantially wattlessly from the alternating electrical energy circulating in said resonant circuit, a modulator tube having input and output electrodes, said output electrodes connected across all of said resonant circuit, and a dissipative phase shift network having input and output terminals, said input terminal connected to an input electrode of said oscillator tube to delay the phase of electrical energy from said oscillator tube ninety electrical degrees with respect to the electrical energy circulating in said resonant circuit to give the electrical characteristic of a dissipationless inductor, the output terminal of said network connected to the input electrode of said modulator tube.

References Cited in the file of this patent

UNITED STATES PATENTS

| | | |
|---|---|---|
| 2,428,930 | Clark et al. | Oct. 14, 1947 |
| 2,441,504 | O'Brien | May 11, 1948 |
| 2,486,265 | Dennis | Oct. 25, 1949 |
| 2,713,149 | Mesner | July 12, 1955 |

OTHER REFERENCES

"Wide Deviation Reactance Modulator" by Helfrich, Jr., in Electronics, April 1948, pages 120 and 121.